United States Patent
Son et al.

(10) Patent No.: US 10,847,594 B2
(45) Date of Patent: Nov. 24, 2020

(54) ORGANIC LIGHT EMITTING DISPLAY DEVICE

(71) Applicant: Samsung Display Co., Ltd., Yongin-si (KR)

(72) Inventors: Kyoung Seok Son, Seoul (KR); Jaybum Kim, Seoul (KR); Yeon Keon Moon, Hwaseong-si (KR); Jun Hyung Lim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/254,297

(22) Filed: Jan. 22, 2019

(65) Prior Publication Data
US 2019/0252478 A1  Aug. 15, 2019

(30) Foreign Application Priority Data
Feb. 12, 2018 (KR) .................. 10-2018-0017149

(51) Int. Cl.
*H01L 29/08* (2006.01)
*H01L 27/32* (2006.01)
*H01L 27/12* (2006.01)

(52) U.S. Cl.
CPC ...... *H01L 27/3262* (2013.01); *H01L 27/3246* (2013.01); *H01L 27/3248* (2013.01); *H01L 27/3258* (2013.01); *H01L 27/1251* (2013.01)

(58) Field of Classification Search
CPC ............. H01L 27/3262; H01L 27/3246; H01L 27/3248; H01L 27/3258; H01L 27/1251
See application file for complete search history.

(56) References Cited

U.S. PATENT DOCUMENTS

| 9,129,927 | B2 | 9/2015 | Gupta et al. |
| 9,543,370 | B2 | 1/2017 | Tsai et al. |
| 2009/0001452 | A1* | 1/2009 | Takano .................. H01L 27/105 257/326 |

FOREIGN PATENT DOCUMENTS

| JP | 5702578 B2 | 6/2011 |
| JP | 6057106 B2 | 12/2014 |
| JP | 2016178657 A | 10/2016 |
| JP | 2017126693 A | 7/2017 |
| KR | 1020080104588 A | 12/2008 |

* cited by examiner

*Primary Examiner* — Victor A Mandala
*Assistant Examiner* — Colleen E Snow
(74) *Attorney, Agent, or Firm* — Innovation Counsel LLP

(57) ABSTRACT

An organic light emitting display device includes a substrate, a first semiconductor element, a second semiconductor element, an insulation layer structure, and a light emitting structure. The substrate has a first region and a second region that is adjacent to the first region. The insulation layer structure is disposed between a second gate electrode and a second active layer of the second semiconductor element. The insulation layer structure includes a first insulation layer having a first etching rate, a second insulation layer disposed on the first insulation layer and having a second etching rate that is greater than the first etching rate, and a third insulation layer disposed on the second insulation layer and having a third etching rate that is less than the second etching rate in a same etching process. The light emitting structure is disposed on the insulation layer structure.

19 Claims, 16 Drawing Sheets

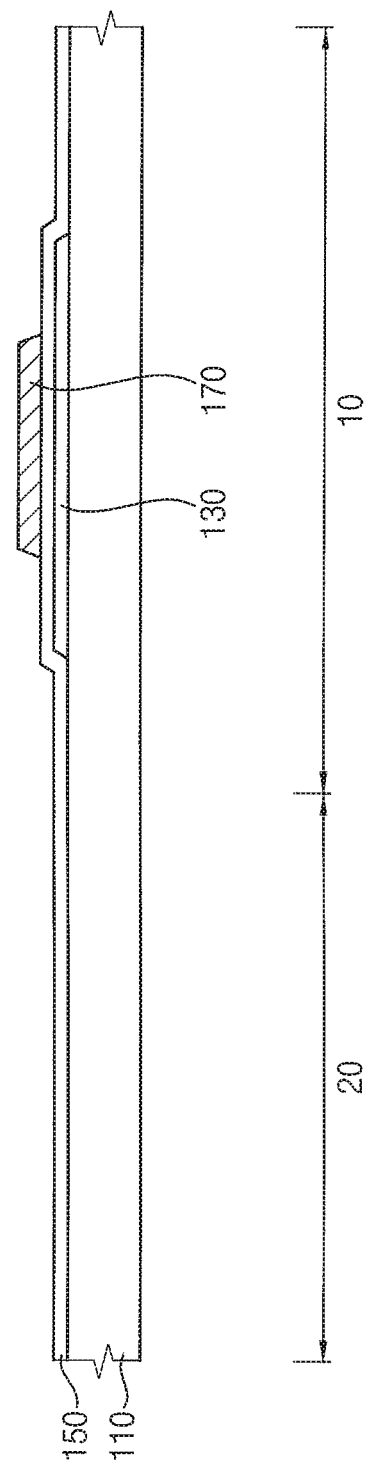

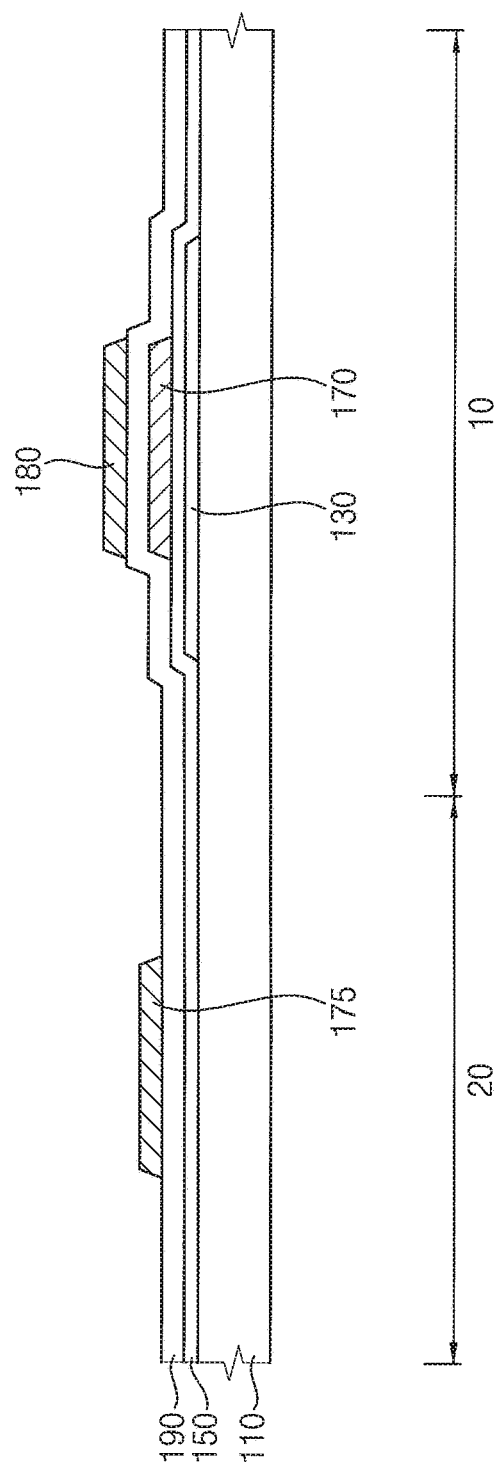

ORGANIC LIGHT EMITTING DISPLAY DEVICE

CROSS-REFERENCE TO RELATED APPLICATION(S)

This application claims priority under 35 USC § 119 to Korean Patent Applications No. 10-2018-0017149, filed on Feb. 12, 2018 in the Korean Intellectual Property Office (KIPO), the contents of which are incorporated herein in its entirety by reference.

BACKGROUND

1. Field

Example embodiments relate generally to an organic light emitting display device. More particularly, embodiments of the present inventive concept relate to an organic light emitting display device including an insulation layer structure.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device.

Recently, the OLED device that simultaneously (or concurrently) includes a silicon-based semiconductor element and a metal oxide-based semiconductor element may have been developed. In a process for forming the silicon-based semiconductor element and the metal oxide-based semiconductor element, a heat treatment process may be performed after a contact hole of the silicon-based semiconductor element is formed. When the heat treatment process is performed, a portion of a silicon semiconductor layer included in the silicon-based semiconductor element may be exposed to an outside through the contact hole. The exposed surface of the silicon semiconductor layer may react with oxygen ions existing in a chamber, such that oxides may be formed on the exposed surface. To remove the oxides, a buffered oxide etchant (BOE) process may be performed. An under cut phenomenon may occur in an insulation layer located in the contact hole by the etchant of the BOE process, and a profile failure of the contact hole may be generated.

SUMMARY

Some example embodiments provide an organic light emitting display (OLED) device including an insulation layer structure.

According to some example embodiments, an OLED device includes a substrate, a first semiconductor element, a second semiconductor element, an insulation layer structure, and a light emitting structure. The substrate has a first region and a second region that is adjacent to the first region. The first semiconductor element includes a first active layer disposed in the first region on the substrate, a first gate electrode disposed on the first active layer, and a first source electrode and a first drain electrode disposed on the first gate electrode. The second semiconductor element includes a second gate electrode disposed in the second region on the substrate, a second active layer disposed on the second gate electrode, and a second source electrode and a second drain electrode disposed on the second active layer electrode. The insulation layer structure is disposed between the second gate electrode and the second active layer. The insulation layer structure includes a first insulation layer having a first etching rate, a second insulation layer disposed on the first insulation layer and having a second etching rate that is greater than the first etching rate, and a third insulation layer disposed on the second insulation layer and having a third etching rate that is less than the second etching rate in a same etching process. The light emitting structure is disposed on the insulation layer structure.

In example embodiments, the first semiconductor element may have a top gate structure and include a silicon-based semiconductor, and the second semiconductor element may have a bottom gate structure and include a metal oxide-based semiconductor.

In example embodiments, the first active layer of the first semiconductor element may include amorphous silicon or polysilicon.

In example embodiments, the third insulation layer of the insulation layer structure may be in contact with a lower surface of the second active layer.

In example embodiments, the first insulation layer and the third insulation layer may include an oxide-based insulation layer, and the second insulation layer may include a nitride-based insulation layer.

In example embodiments, each of the first insulation layer and the third insulation layer may consist essentially of silicon oxide, and the second insulation layer may consist essentially of silicon nitride.

In example embodiments, a thickness of the second insulation layer may be less than a thickness of each of the first and third insulation layers.

In example embodiments, the insulation layer structure may have a first contact hole extending to a first portion of the first active layer and a second contact hole extending to a second portion, which is different from the first portion, of the first active layer. The second insulation layer may have a protrusion in each of the first contact hole and the second contact hole.

In example embodiments, each of the first source electrode and the first drain electrode may have a recess in each of the first contact hole and the second contact hole, respectively.

In example embodiments, the first etching rate may be identical to the third etching rate.

In example embodiments, the OLED device may further include a gate electrode pattern disposed on the first gate electrode.

In example embodiments, the gate electrode pattern and the second gate electrode may be located at a same layer.

In example embodiments, the insulation layer structure may be interposed between the first source electrode and the gate electrode pattern in the first region, the insulation layer structure is interposed between the first drain electrode and the gate electrode pattern in the first region, and the insulation layer structure may be interposed between the second active layer and the second gate electrode in the second region.

In example embodiments, the OLED device may further include a gate insulation layer covering the first active layer in the first region on the substrate, an insulating interlayer covering the first gate electrode in the first region on the gate insulation layer, and a protective insulation layer covering the first source electrode and the first drain electrode and the second source electrode and the second drain electrode on the insulation layer structure.

In example embodiments, the protective insulation layer may be in contact with an upper surface of the second active layer.

In example embodiments, the protective insulation layer may consist essentially of silicon oxide.

In example embodiments, the protective insulation layer may have an opening exposing a portion of an upper surface of the first drain electrode in the first region.

In example embodiments, the light emitting structure may include a lower electrode disposed on the first semiconductor element and the second semiconductor element, a light emitting layer disposed on the lower electrode, and an upper electrode disposed on the light emitting layer.

In example embodiments, the OLED device may further include a planarization layer. The planarization layer may be disposed between the protective insulation layer and the lower electrode, and may have organic materials.

In example embodiments, the planarization layer may have a contact hole that extends to an upper surface of the first drain electrode to which the opening of the protective insulation layer extends. The lower electrode may be in contact with the first drain electrode through the contact hole of the planarization layer.

The OLED device in accordance with example embodiments includes the first insulation layer having the first etching rate, which is less than the second etching rate, under the second insulation layer having the second etching rate in the same etching process. Accordingly, an under cut phenomenon by the etchant used in the buffered oxide etchant (BOE) process may be prevented because the first insulation layer located in the first and second contact holes is etched relatively slower than the second insulation layer in the BOE process.

In addition, as the third insulation layer and the protective insulation layer, which consist essentially of SiOx, are in direct contact with the second active layer, interface characteristics of the second active layer may be relatively increased. Accordingly, the OLED device according to example embodiments may include the second semiconductor element where reliability is increased.

In a method of manufacturing the OLED device according to example embodiments, a heat treatment process is performed on the first active layer and the second active layer. When the heat treatment process is performed, a driving-range of a first semiconductor element that corresponds to a driving transistor may be relatively widened, and the second semiconductor element that is relatively precise may be obtained because a scattering of a threshold voltage of a second semiconductor element that corresponds to a switching transistor is reduced. In addition, as the heat treatment process is simultaneously performed on the first active layer and the second active layer, a manufacturing cost of the OLED device may be relatively decreased.

BRIEF DESCRIPTION OF THE DRAWINGS

Example embodiments can be understood in more detail from the following description taken in conjunction with the accompanying drawings, in which:

FIGS. 4, 5, 6, 7, 8, 9, 10, 11, 12, 13, 14, 15, and 16 are cross-sectional views illustrating a method of manufacturing an OLED device in accordance with example embodiments.

DETAILED DESCRIPTION OF THE EMBODIMENTS

Hereinafter, embodiments of the present inventive concept will be explained in detail with reference to the accompanying drawings.

Figure 1:
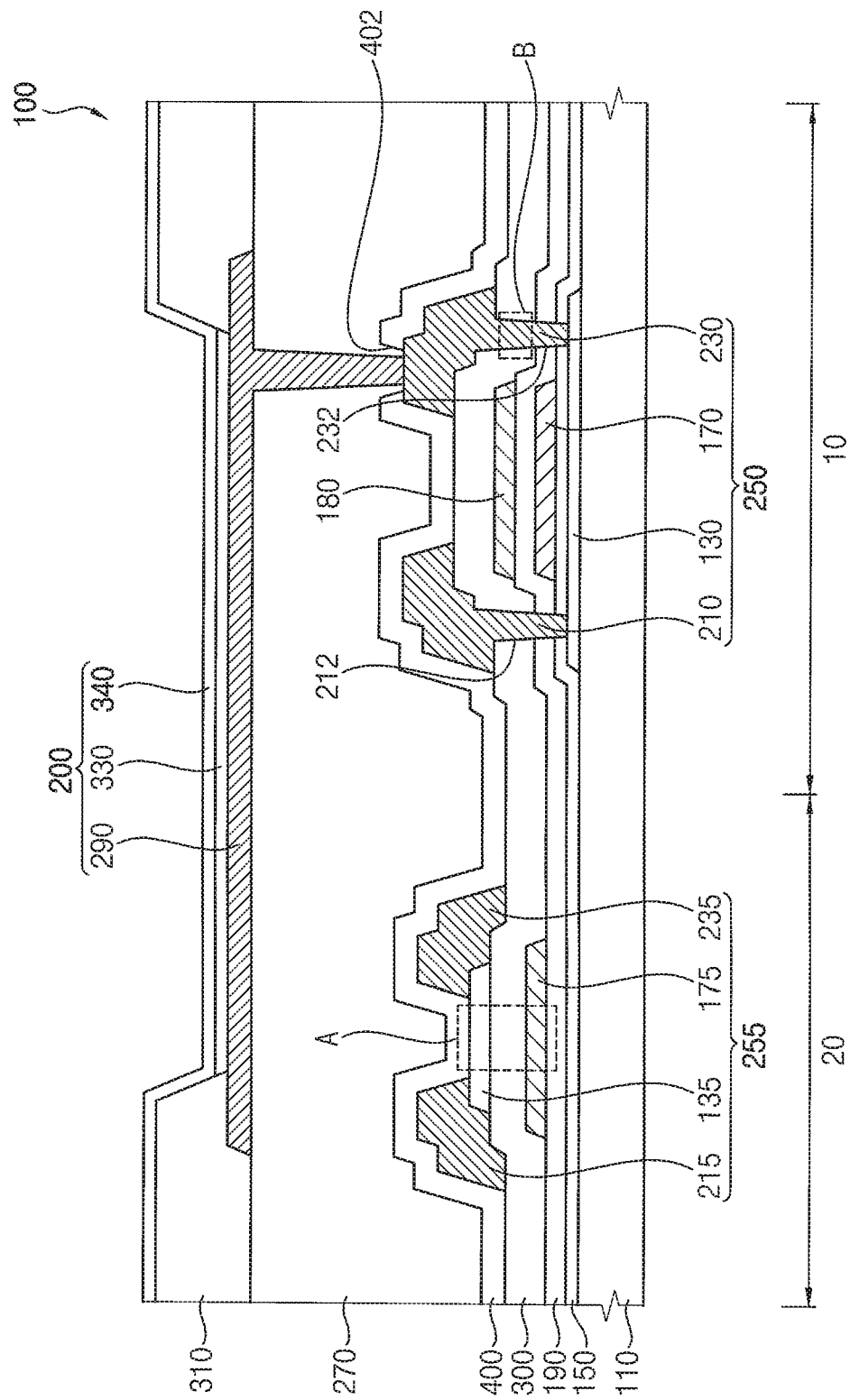
FIG. 1 is a cross-sectional view illustrating an organic light emitting display (OLED) device in accordance with example embodiments.
Figure 2:
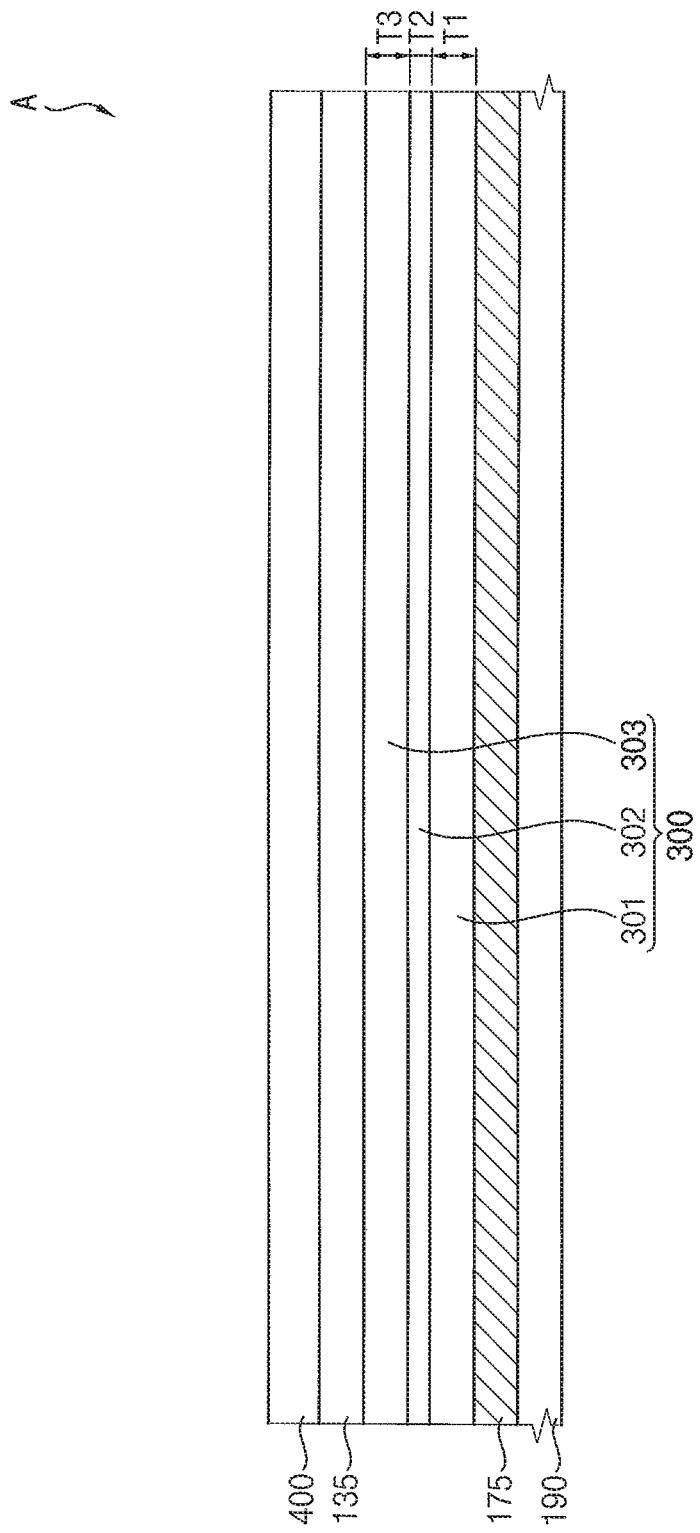
FIG. 2 is an enlarged cross-sectional view corresponding to region 'A' of FIG. 1.
Figure 3A:
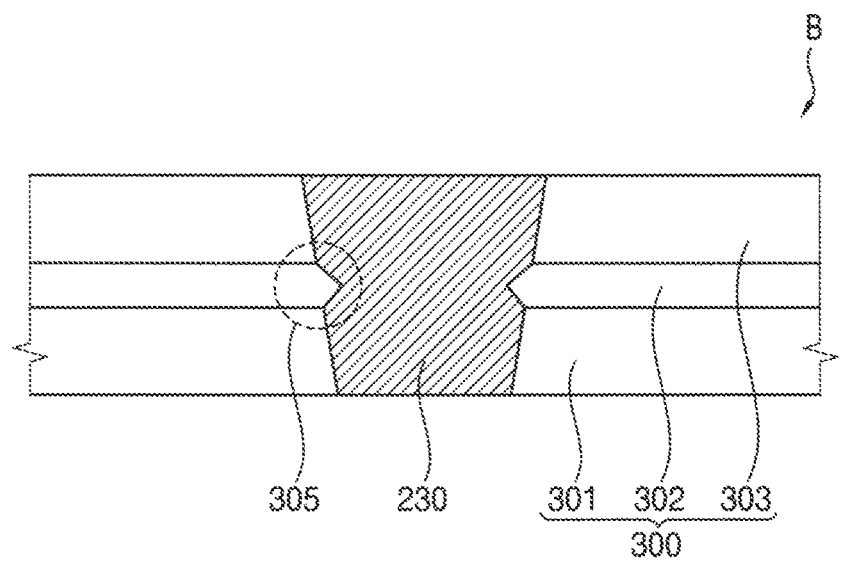
FIG. 3A is an enlarged cross-sectional view corresponding to region 'B' of FIG. 1.
Figure 3B:
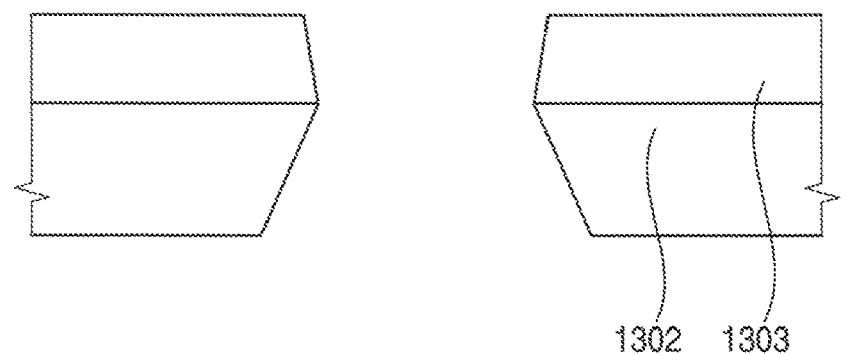
FIG. 3B is an enlarged cross-sectional view for describing an under-cut phenomenon.

FIG. 1 is a cross-sectional view illustrating an organic light emitting display (OLED) device 100 in accordance with example embodiments. FIG. 2 is an enlarged cross-sectional view corresponding to region 'A' of FIG. 1. FIG. 3A is an enlarged cross-sectional view corresponding to region 'B' of FIG. 1. FIG. 3B is an enlarged cross-sectional view for describing an under-cut phenomenon.

Referring to FIGS. 1, 2 and 3A, the OLED device 100 may include a substrate 110, a first semiconductor element 250, a second semiconductor element 255, a gate electrode pattern 180, a gate insulation layer 150, an insulating interlayer 190, an insulation layer structure 300, a protective insulation layer 400, a planarization layer 270, a light emitting structure 200, a pixel defining layer 310, etc. Here, the first semiconductor element 250 may include a first active layer 130, a first gate electrode 170, a first source electrode 210, and a first drain electrode 230. The second semiconductor element 255 may include a second active layer 135, a second gate electrode 175, a second source electrode 215, and a second drain electrode 235. In addition, the insulation layer structure 300 may include a first insulation layer 301, a second insulation layer 302, and a third insulation layer 303. The light emitting structure 200 may include a lower electrode 290, a light emitting layer 330, and an upper electrode 340. Further, each of the first source electrode 210 and the first drain electrode 230 may be in contact with the first active layer 130 through each of a first contact hole 212 and a second contact hole 232, respectively.

As the OLED device 100 includes the insulation layer structure 300, the OLED device 100 may prevent a profile failure of the first contact hole 212 and the second contact hole 232, and each of the first source electrode 210 and the first drain electrode 230 may be readily connected to the first active layer 130.

The substrate 110 including transparent or opaque insulation materials may be provided. For example, the substrate 110 may include a quartz substrate, a synthetic quartz substrate, a calcium fluoride substrate, a fluoride-doped quartz substrate, a sodalime glass substrate, a non-alkali glass substrate etc. Alternatively, the substrate 110 may include a flexible transparent material such as a flexible transparent resin substrate, e.g., a polyimide substrate. In this case, the polyimide substrate may include a first polyimide layer, a barrier film layer, a second polyimide layer, etc. For example, the polyimide substrate may have a configuration where the first polyimide layer, the barrier film layer, and the second polyimide layer, are stack on the a rigid glass substrate. Since the polyimide substrate is relatively thin and flexible, the polyimide substrate may be formed on a rigid glass substrate to help support the formation of an upper structure, e.g., the first semiconductor element 250, the second semiconductor element 255, the light emitting structure 200, etc. In a manufacturing the OLED device 100, after an insulation layer, e.g., a buffer layer, is provided on the second polyimide layer of the polyimide substrate, the upper structure may be formed on the insulation layer. After the upper structure is formed on the buffer layer, the rigid glass substrate on which the polyimide substrate is formed may be removed. It may be difficult to directly form the upper structure on the polyimide substrate because the polyimide substrate is relatively thin and flexible. Accordingly, the upper structure is formed on the polyimide substrate and the rigid glass substrate, and then the polyimide substrate may serve as the substrate 110 after the removal of the rigid glass substrate. In example embodiments, the substrate 110 may have a first region 10 and a second region 20, and the first region 10 may be located adjacent to the second region 20. For example, the first region 10 may be a region where a driving transistor is disposed, and the second region 20 may be a region where a switching transistor is disposed.

A buffer layer (not shown) may be disposed on the substrate 110. The buffer layer may be disposed on the entire substrate 110. The buffer layer may prevent the diffusion of metal atoms and/or impurities from the substrate 110 into the first semiconductor element 250, the second semiconductor element 255, and the light emitting structure 200. In addition, the buffer layer may control a rate of a heat transfer in a crystallization process for forming an active layer, thereby obtaining a substantially uniform active layer. Further, the buffer layer may improve a surface flatness of the substrate 110 when a surface of the substrate 110 is relatively irregular. According to a type of the substrate 110, at least two buffer layers may be provided on the substrate 110, or the buffer layer may not be disposed. For example, the buffer layer may include organic materials or inorganic materials.

The first active layer 130 may be disposed in the first region 10 on the substrate 110. For example, the first active layer 130 may include an oxide semiconductor, amorphous silicon, polysilicon, an organic semiconductor, etc. In example embodiments, the first active layer 130 may include a silicon-based semiconductor, and may consist essentially of amorphous silicon or polysilicon.

The gate insulation layer 150 may be disposed in the first region 10 and the second region 20 on the substrate 110 and the first active layer 130. The gate insulation layer 150 may cover the first active layer 130 in the first region 10 on the substrate 110, and may be disposed on the entire substrate 110. For example, the gate insulation layer 150 may cover the first active layer 130 on the substrate 110, and may be disposed as a substantially uniform thickness along a profile of the first active layer 130. Alternatively, the gate insulation layer 150 may sufficiently cover the first active layer 130 on the substrate 110, and may have a substantially flat upper surface without a step around the first active layer 130. The gate insulation layer 150 may include silicon compound, metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The first gate electrode 170 may be disposed in the first region 10 on the gate insulation layer 150. The first gate electrode 170 may be disposed on a portion of the gate insulation layer 150 under which the first active layer 130 is located. The first gate electrode 170 may include a metal, a metal alloy, metal nitride, conductive metal oxide, transparent conductive materials, etc. For example, the first gate electrode 170 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chrome (Cr), tantalum (Ta), molybdenum (Mo), scandium (Sc), neodymium (Nd), iridium (Jr), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a suitable combination thereof. Alternatively, the first gate electrode 170 may have a multi-layered structure including a plurality of layers.

The insulating interlayer 190 may be disposed in the first and second regions 10 and 20 on the gate insulation layer 150 and the first gate electrode 170. The insulating interlayer 190 may cover the first gate electrode 170 in the first region 10 on the gate insulation layer 150, and may be disposed on the entire gate insulation layer 150. For example, the insulating interlayer 190 may cover the first gate electrode 170 on the gate insulation layer 150, and may be disposed as a substantially uniform thickness along a profile of the first gate electrode 170. Alternatively, the insulating interlayer 190 may sufficiently cover the first gate electrode 170 on the gate insulation layer 150, and may have a substantially flat upper surface without a step around the first gate electrode 170. The insulating interlayer 190 may include silicon compound, metal oxide, etc.

The gate electrode pattern 180 may be disposed in the first region 10 on the insulating interlayer 190. The gate electrode pattern 180 may be disposed on a portion of the insulating interlayer 190 under which the first gate electrode 170 is located. The gate electrode pattern 180 may serve as a wiring. For example, the gate electrode pattern 180 may be data signal wirings providing a data signal, gate signal wirings providing a gate signal, initialization signal wirings providing an initialization signal, light emission wirings providing a light emission signal, power supply voltage wirings providing a power supply voltage, etc. The gate electrode pattern 180 may include a metal, an alloy of a metal, metal nitride, conductive metal oxide, transparent conductive materials, etc.

The second gate electrode 175 may be disposed in the second region 20 on the insulating interlayer 190. In example embodiments, the second gate electrode 175 and the gate electrode pattern 180 may be located at a same layer, and may be simultaneously formed using same materials. The second gate electrode 175 may include a metal, an alloy of a metal, metal nitride, conductive metal oxide, transparent conductive materials, etc.

Referring again to FIGS. 1 and 2, the insulation layer structure 300 may be disposed on the insulating interlayer 190, the second gate electrode 175, and the gate electrode pattern 180. In example embodiments, the insulation layer structure 300 may be interposed between the first source and first drain electrodes 210 and 230 and the gate electrode pattern 180 in the first region 10, and may be interposed between the second active layer 135 and the second gate electrode 175 in the second region 20. The insulation layer structure 300 may include the first insulation layer 301, the second insulation layer 302, and the third insulation layer 303.

The first insulation layer 301 may cover the gate electrode pattern 180 in the first region 10 and the second gate electrode 175 in the second region 20 on the insulating interlayer 190, and may be disposed on the entire insulating interlayer 190. For example, the first insulation layer 301 may cover the gate electrode pattern 180 and the second gate electrode 175 on the insulating interlayer 190, and may be disposed as a substantially uniform thickness along a profile of the gate electrode pattern 180 and the second gate electrode 175. Alternatively, the first insulation layer 301 may sufficiently cover the gate electrode pattern 180 and the second gate electrode 175 on the insulating interlayer 190, and may have a substantially flat upper surface without a step around the gate electrode pattern 180 and the second gate electrode 175. In example embodiments, in a same etching process using an etchant of a buffered oxide etchant (BOE) process, the first insulation layer 301 may have a first etching rate (e.g., the amount of etch per time). Here, the first insulation layer 301 may include an oxide-based insulation layer having the first etching rate. For example, the first insulation layer 301 may consist essentially of SiOx or AlOx. In addition, the first insulation layer 301 may have a first thickness T1.

The second insulation layer 302 may be disposed on the first insulation layer 301. The second insulation layer 302 may be disposed on the entire first insulation layer 301. For example, the second insulation layer 302 may be disposed as a substantially uniform thickness along a profile of the first insulation layer 301. Alternatively, the second insulation layer 302 may sufficiently cover the first insulation layer 301, and may have a substantially flat upper surface.

The second insulation layer 302 may prevent excess oxygen defects of the second active layer 135 and dangling bond defects of the first active layer 130. In example embodiments, in the same etching process using the etchant of the BOE process, the second insulation layer 302 may have a second etching rate that is greater than the first etching rate. For example, in the same etching process using the etchant of the BOE process, the second insulation layer 302 may be etched faster than the first insulation layer 301. In other words, in the same etching process using the etchant of the BOE process, the second insulation layer 302 may be etched more than the first insulation layer 301. Here, the second insulation layer 302 may include a nitride-based insulation having the second etching rate. For example, the second insulation layer 302 may consist essentially of SiNx or TiNx. In addition, the second insulation layer 302 may have a second thickness T2 that is less than the first thickness T1. Further, as illustrated in FIG. 3A, the second insulation layer 302 may have a protrusion 305, which is protruded inward each of the first and second contact holes 212 and 232, in a portion where the first contact hole 212 and the second contact hole 232 are located.

The third insulation layer 303 may be disposed on the second insulation layer 302. The third insulation layer 303 may be disposed on the entire second insulation layer 302. For example, the third insulation layer 303 may be disposed as a substantially uniform thickness along a profile of the second insulation layer 302. Alternatively, the third insulation layer 303 may sufficiently cover the second insulation layer 302, and may have a substantially flat upper surface. In example embodiments, in the same etching process using the etchant of the BOE process, the third insulation layer 303 may have a third etching rate that is less than the second etching rate. Here, the third insulation layer 303 may include an oxide-based insulation having the third etching rate. For example, the third insulation layer 303 may consist essentially of SiOx or AlOx. In addition, the third insulation layer 303 may have a third thickness T3. The first insulation layer 301 and the third insulation layer 303 may include same materials, and the first thickness T1 may be identical to the third thickness T3. The first etching rate and the third etching rate may be substantially a same. In addition, the second thickness T2 may be less than 30% of a thickness of the insulation layer structure 300. Alternatively, the first thickness T1 may be different from the third thickness T3, and the first etching rate may be different from the third etching rate. However, the first and third thicknesses T1 and T3 should be greater than the second thickness T2, and the third etching rate should be less than the second etching rate. Accordingly, the insulation layer structure 300 including the first insulation layer 301, the second insulation layer 302, and the third insulation layer 303 may be constituted.

In example embodiments, the insulation layer structure 300 has three layers, e.g., the first insulation layer 301, the second insulation layer 302, and the third insulation layer 303, but not being limited thereto. For example, the insulation layer structure 300 may have at least four layers.

In example embodiments, the third insulation layer 303 may be in direct contact with the second active layer 135 so as to secure characteristics or reliability of the second semiconductor element 255. In other words, an upper surface of the third insulation layer 303 may be in direct contact with a lower surface of the second active layer 135, and a lower surface of the third insulation layer 303 may be in direct contact with an upper surface of the second insulation layer 302. For example, when the second active layer 135 consisting essentially of an oxide semiconductor is in direct contact with the third insulation layer 303 consisting essentially of SiOx, interface characteristics of the second active layer 135 may be relatively improved.

In a process for forming the first contact hole 212 and the second contact hole 232, a portion of side walls of each of the first contact hole 212 and the second contact hole 232 located in the first region 10 may be removed while the BOE process is performed. For example, when the BOE process is performed after a heat treatment process is performed in the first contact hole 212 and the second contact hole 232, the insulation layer structure 300 may include the first insulation layer 301 having the first etching rate, which is disposed under the second insulation layer 302 having the second etching rate, such that an under cut phenomenon is not generated in side walls of the insulation layer structure 300 located in the first contact hole 212 and the second contact hole 232.

For example, as illustrated in FIG. 3B, when a conventional insulation layer structure consists essentially of a third insulation layer 1303 including SiOx and a second insulation layer 1302 including SiNx, an under cut phenomenon may occur in side walls of the second insulation layer located in first and second contact holes by the etchant of the BOE process. Here, a composition ratio of N/Si of SiNx included in the second insulation layer 1302 may be in a range between about 0.5 and about 1, and a thickness of SiNx is about 200 nanometers. In other words, in a same etching process using the etchant of the BOE process, SiNx may have a relatively higher etching rate than SiOx. In this case, since the second insulation layer located in the first and second contact holes is etched relatively faster than the third insulation layer, erosion (or etching) of side walls of the second insulation layer may occur, and profile defects of the first and second contact holes may be generated or a contact resistance of the first and second contact holes may be increased. That is, when the erosion of side walls occurs, the under cut phenomenon having a shape where a width of the contact hole of the second insulation layer is greater than a width of the contact hole of the third insulation layer (e.g., a shape of a contact hole where a bottom of the contact hole is extended) may be generated.

In example embodiments, a composition ratio of N/Si of the second insulation layer 302 may be in a range between about 1 and about 2, and a thickness of second insulation layer 302 is about 100 nanometers. Here, a ratio of N of the second insulation layer 302 may be relatively high, and a density of the second insulation layer 302 may be dense. Accordingly, as an etching ratio of the second insulation layer 302 is relatively slow, the second insulation layer 302 may have the protrusion 305. In addition, the second insulation layer 302 may have a relatively small thickness such that the protrusion 305 is made small.

The OLED device 100 according to example embodiments includes the first insulation layer 301 having the first etching rate, which is less than the second etching rate, under the second insulation layer 302 having the second etching rate in the same etching process using the etchant of the BOE process. Accordingly, the under cut phenomenon by the etchant used in the BOE process may be prevented because the first insulation layer 301 located in the first and second contact holes 212 and 232 is etched relatively slower than the second insulation layer 302 in the BOE process. The protrusion 305 may be formed in the second insulation layer 302 located in the first and second contact holes 212 and 232 due to an etching rate difference of the first insulation layer 301 and the second insulation layer 302. In example embodiments, the second thickness T2 of the second insulation layer 302 may be less than the first thickness T1 and the third thickness T3 such that a size of the protrusion 305 is not formed as a relatively large size. For example, when a thickness of the second insulation layer 302 is formed as a relatively thick thickness, a size of the protrusion 305 may be formed as a relatively large size. In this case, the first source electrode 210 and the first drain electrode 230 may not be in contact with the first active layer 130, or a contact resistance may be increased. Thus, a thickness of the second insulation layer 302 may be formed less than 30% of a thickness of the insulation layer structure 300.

The first source electrode 210 and the first drain electrode 230 may be disposed in the first region 10 on the insulation layer structure 300. The first source electrode 210 may be in contact with a source region of the first active layer 130 via the first contact hole 212 formed by removing a first portion of the insulation layer structure 300, the insulating interlayer 190, and the gate insulation layer 150. The first drain electrode 230 may be in contact with a drain region of the first active layer 130 via the second contact hole 232 formed by removing a second portion of the insulation layer structure 300, the insulating interlayer 190, and the gate insulation layer 150. As illustrated in FIG. 3A, each of the first source electrode 210 and the first drain electrode 230 may have a recess located adjacent to the protrusion 305 due to the protrusion 305 of the second insulation layer 302. Each of the first source electrode 210 and the first drain electrode 230 may include a metal, an alloy, metal nitride, conductive metal oxide, transparent conductive materials, etc. These may be used alone or in a suitable combination thereof. Alternatively, each of the first source electrode 210 and the first drain electrode 230 may have a multi-layered structure including a plurality of layers. Accordingly, the first semiconductor element 250 including the first active layer 130, the first gate electrode 170, the first source electrode 210, and the first drain electrode 230 may be constituted. Here, the first semiconductor element 250 may serve as a driving transistor having a silicon-based semiconductor. In addition, the first semiconductor element 250 may serve as a transistor having a top gate structure.

The second active layer 135 may be disposed in the second region 20 on the insulation layer structure 300. The second active layer 135 may be disposed on a portion of the insulation layer structure 300 under which the second gate electrode 175 is located. The second active layer 135 may include an oxide semiconductor. In other words, the second active layer 135 may include an oxide semiconductor layer including at least one of two-component compound (ABx), ternary compound (ABxCy), four-component compound (ABxCyDz), etc. These compounds contain indium (In), zinc (Zn), gallium (Ga), tin (Sn), titanium (Ti), aluminum (Al), hafnium (Hf), zirconium (Zr), magnesium (Mg), etc. For example, the second active layer 135 may include at least one of zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), etc.

The second source electrode 215 and the second drain electrode 235 may be disposed in the second region 20 on the insulation layer structure 300. The second source electrode 215 may cover a first lateral portion of the second active layer 135, and the second drain electrode 235 may cover a second lateral portion of the second active layer 135. Here, the first lateral portion may be different from the second lateral portion. In other words, the second source and second drain electrodes 215 and 235 may cover both lateral portions of the second active layer 135, and may expose a portion of an upper surface of the second active layer 135. Each of the second source and second drain electrodes 215 and 235 may include a metal, an alloy of a metal, metal nitride, conductive metal oxide, transparent conductive materials, etc. These may be used alone or in a suitable combination thereof. In example embodiments, the first source and first drain electrodes 210 and 230 and the second source and second drain electrodes 215 and 235 may be located at a same layer, and may be simultaneously formed using same materials. In some example embodiments, each of the second source and second drain electrodes 215 and 235 may have a multi-layered structure including a plurality of layers. Accordingly, the second semiconductor element 255 including the second active layer 135, the second gate electrode 175, the second source electrode 215, and the second drain electrode 235 may be constituted. Here, the second semiconductor element 255 may serve as a switching transistor including an oxide-based semiconductor. In addition, the second semiconductor element 255 may serve as a transistor having a bottom gate structure.

In example embodiments, the OLED device 100 includes two transistors, e.g., the first semiconductor element 250 and the second semiconductor element 255, but not being limited thereto. For example, the OLED device 100 may include at least three transistors and at least one capacitor.

The protective insulation layer 400 may be disposed on the insulation layer structure 300, the first source and first drain electrodes 210 and 230, and the second source and second drain electrodes 215 and 235. The protective insulation layer 400 may cover the first source and first drain electrodes 210 and 230 in the first region 10 and the second source and second drain electrodes 215 and 235 in the second region 20 on the insulation layer structure 300, and may be disposed on the entire insulation layer structure 300. For example, the protective insulation layer 400 may cover the first source and first drain electrodes 210 and 230 and the second source and second drain electrodes 215 and 235 on the insulation layer structure 300, and may be disposed as a substantially uniform thickness along a profile of the first source and first drain electrodes 210 and 230 and the second source and second drain electrodes 215 and 235. Alternatively, the protective insulation layer 400 may sufficiently cover the first source and first drain electrodes 210 and 230 and the second source and second drain electrodes 215 and 235 on the insulation layer structure 300, and may have a substantially flat upper surface without a step around the first source and first drain electrodes 210 and 230 and the second source and second drain electrodes 215 and 235. In example embodiments, the protective insulation layer 400 may have an opening 402 exposing a portion of an upper surface of the first drain electrode 230 in the first region 10. The lower electrode 290 may be in contact with the first drain electrode 230 through the opening 402 and a contact hole of the planarization layer 270. The protective insulation layer 400 may include silicon compound, metal oxide, etc. In example embodiments, the protective insulation layer 400 may consist essentially of SiOx. In addition, the protective insulation layer 400 may be in direct contact with an upper surface of the second active layer 135. As the protective insulation layer 400 consisting essentially of SiOx is in direct contact with the second active layer 135, interface characteristics of the second active layer 135 may be relatively improved.

The planarization layer 270 may be disposed on the protective insulation layer 400. The planarization layer 270 may be disposed on the entire protective insulation layer 400. For example, the planarization layer 270 may be disposed as a high thickness to sufficiently cover the protective insulation layer 400. In this case, the planarization layer 270 may have a substantially flat upper surface, and a planarization process may be further performed on the planarization layer 270 to implement the flat upper surface of the planarization layer 270. A portion of an upper surface of the first drain electrode 230 may be exposed via a contact hole formed by removing a portion of the planarization layer 270. The planarization layer 270 may include organic materials or inorganic materials. In example embodiments, the planarization layer 270 may include organic materials such as polyimide, epoxy-based resin, acryl-based resin, polyester, photoresist, polyacryl-based resin, polyimide-based resin, a polyamide-based resin, a siloxane-based resin, etc.

The lower electrode 290 may be disposed on the planarization layer 270. The lower electrode 290 may be in direct contact with the first drain electrode 230 via the contact hole of the planarization layer 270, and may be electrically connected to the first semiconductor element 250. The lower electrode 290 may include a metal, a metal alloy, metal nitride, conductive metal oxide, transparent conductive materials, etc. These may be used alone or in a suitable combination thereof. Alternatively, the lower electrode 290 may have a multi-layered structure including a plurality of layers.

The pixel defining layer 310 may be disposed on a portion of the lower electrode 290 and the planarization layer 270. The pixel defining layer 310 may cover both lateral portions of the lower electrode 290, and may expose a portion of an upper surface of the lower electrode 290. The pixel defining layer 310 may include organic materials or inorganic materials. In example embodiments, the pixel defining layer 310 may include organic materials.

The light emitting layer 330 may be disposed on the lower electrode 290 exposed by the pixel defining layer 310. The light emitting layer 330 may be formed using at least one of light emitting materials capable of generating different colors of light, e.g., a red color of light, a blue color of light, and a green color of light, etc., according to sub-pixels. Alternatively, the light emitting layer 330 may generally generate a white color of light by stacking a plurality of light emitting materials capable of generating different colors of light such as a red color of light, a green color of light, a blue color of light, etc. In this case, a color filter may be disposed on the light emitting layer 330, e.g., to overlap the light emitting layer 330 on a lower surface of an encapsulation substrate. The color filter may include at least one selected from a red color filter, a green color filter, and a blue color filter. Alternatively, the color filter may include a yellow color filter, a cyan color filter, and a magenta color filter. The color filter may include a photosensitive resin, etc.

The upper electrode 340 may be disposed on the pixel defining layer 310 and the light emitting layer 330. The upper electrode 340 may cover the light emitting layer 330 and the pixel defining layer 310, and may be entirely disposed on the light emitting layer 330 and the pixel defining layer 310. The upper electrode 340 may include a metal, a metal alloy, metal nitride, conductive metal oxide, transparent conductive materials, etc. These may be used alone or in a suitable combination thereof. Alternatively, the upper electrode 340 may have a multi-layered structure including a plurality of layers. Accordingly, the light emitting structure 200 including the lower electrode 290, the light emitting layer 330, and the upper electrode 340 may be constituted.

An encapsulation substrate (not shown) may be disposed on the upper electrode 340. The encapsulation substrate and the substrate 110 may include substantially the same materials. For example, the encapsulation substrate may include a quartz substrate, a synthetic quartz substrate, a calcium fluoride substrate, a fluoride-doped quartz substrate, a sodalime glass substrate, a non-alkali glass substrate, etc. In some example embodiments, the encapsulation substrate may include a transparent inorganic material or flexible plastic. For example, the encapsulation substrate may include a flexible transparent resin substrate. In this case, to increase flexibility of the OLED device 100, the encapsulation substrate may have a stacked structure where at least one inorganic layer and at least one organic layer are alternately stacked. Accordingly, the OLED device 100 may be constituted.

As the third insulation layer 303 and the protective insulation layer 400, which consist essentially of SiOx, are in direct contact with the second active layer 135, interface characteristics of the second active layer 135 may be relatively increased. Accordingly, the OLED device 100 according to example embodiments may include the second semiconductor element 255 where reliability is increased.

In addition, the OLED device 100 in accordance with example embodiments includes the first insulation layer 301 having the first etching rate, which is less than the second etching rate, under the second insulation layer 302 having the second etching rate in the same etching process using the etchant of the BOE process. Accordingly, under cut phenomenon by the etchant used in the BOE process may be prevented because the first insulation layer 301 located in the first and second contact holes 212 and 232 is etched relatively slower than the second insulation layer 302 in the BOE process.

Figure 6:
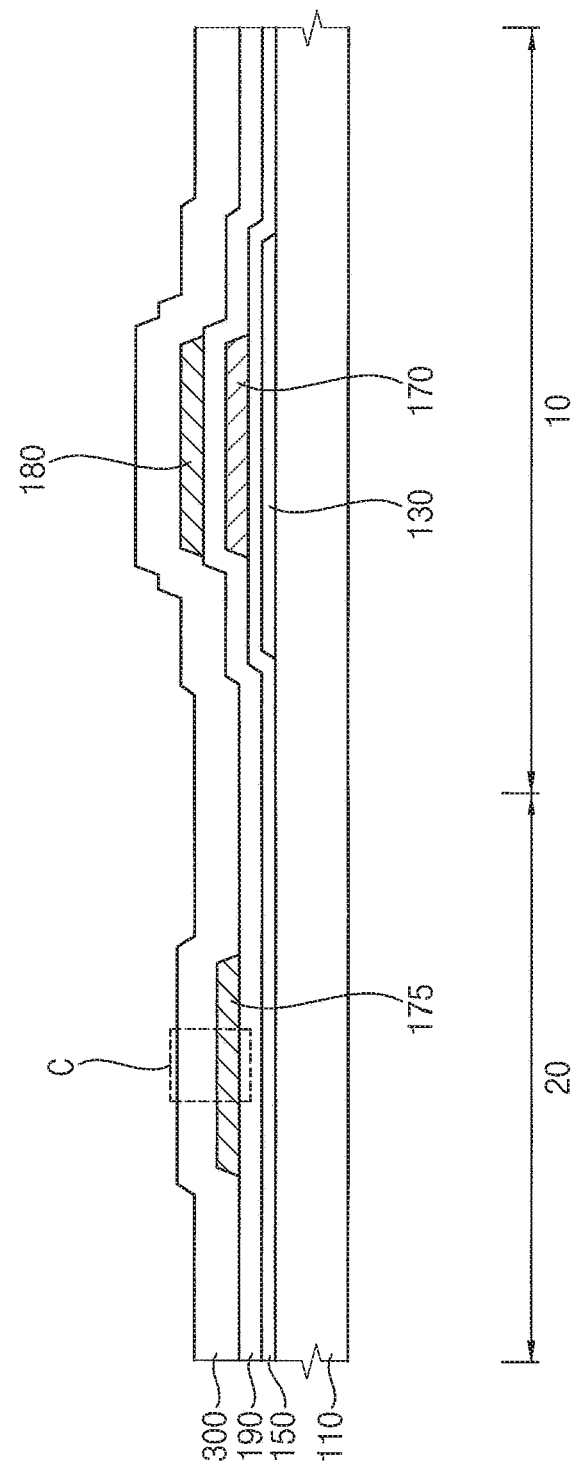
Figure 7:
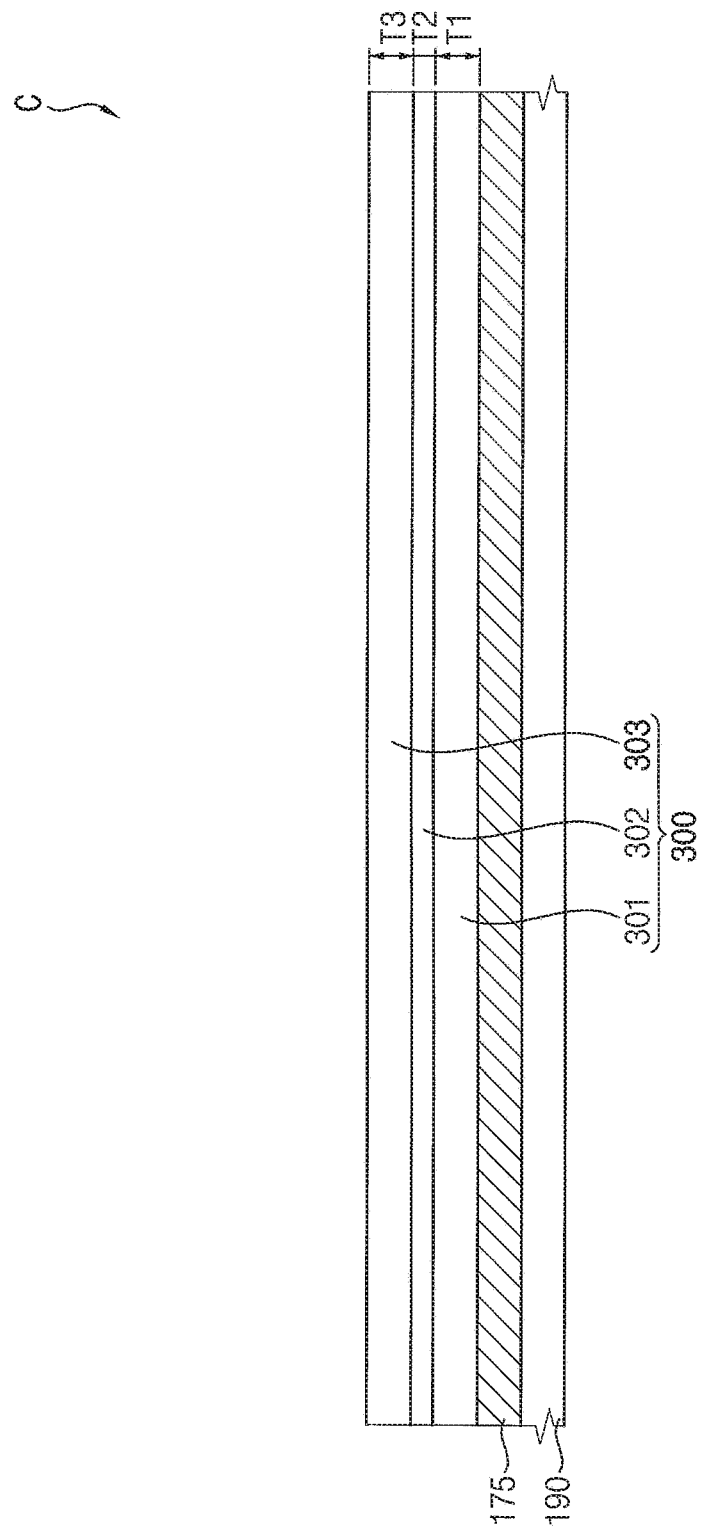

FIGS. 4, 5, 6, 7, 8, 9, 10, 11, 12, 13, 14, 15, and 16 are cross-sectional views illustrating a method of manufacturing an OLED device in accordance with example embodiments. For example, FIG. 7 is an enlarged cross-sectional view corresponding to region 'C' of FIG. 6, and FIG. 11 is an enlarged cross-sectional view corresponding to region 'D' of FIG. 10. In addition, FIG. 13 is an enlarged cross-sectional view corresponding to region 'E' of FIG. 12.

Referring to FIG. 4, a substrate 110 including transparent or opaque insulation materials may be provided. For example, the substrate 110 may be formed using a quartz substrate, a synthetic quartz substrate, a calcium fluoride substrate, a fluoride-doped quartz substrate, a sodalime glass substrate, a non-alkali glass substrate etc. Alternatively, the substrate 110 may be formed using a flexible transparent material such as a flexible transparent resin substrate (e.g., a polyimide substrate). In example embodiments, the substrate 110 may have a first region 10 and a second region 20, and the first region 10 may be located adjacent to the second region 20.

A buffer layer (not shown) may be formed on the substrate 110. The buffer layer may be formed on the entire substrate 110. The buffer layer may prevent the diffusion of metal atoms and/or impurities from the substrate 110. In addition, the buffer layer may control a rate of a heat transfer in a crystallization process for forming an active layer, thereby obtaining a substantially uniform active layer. Further, the buffer layer may improve a surface flatness of the substrate 110 when a surface of the substrate 110 is relatively irregular. According to a type of the substrate 110, at least two buffer layers may be provided on the substrate 110, or the buffer layer may not be disposed. For example, the buffer layer may be formed using organic materials or inorganic materials.

A first active layer 130 may be formed in the first region 10 on the substrate 110. For example, the first active layer 130 may be formed using an oxide semiconductor, amorphous silicon, polysilicon, an organic semiconductor, etc. In example embodiments, the first active layer 130 may include a silicon-based semiconductor, and may consist essentially of amorphous silicon or polysilicon.

A gate insulation layer 150 may be formed in the first region 10 and the second region 20 on the substrate 110 and the first active layer 130. The gate insulation layer 150 may cover the first active layer 130 in the first region 10 on the substrate 110, and may be formed on the entire substrate 110. For example, the gate insulation layer 150 may cover the first active layer 130 on the substrate 110, and may be formed as a substantially uniform thickness along a profile of the first active layer 130. Alternatively, the gate insulation layer 150 may sufficiently cover the first active layer 130 on the substrate 110, and may have a substantially flat upper surface without a step around the first active layer 130. The gate insulation layer 150 may be formed using silicon compound, metal oxide, etc. For example, the gate insulation layer 150 may include SiOx, SiNx, SiOxNy, SiOxCy, SiCxNy, AlOx, AlNx, TaOx, HfOx, ZrOx, TiOx, etc.

A first gate electrode 170 may be formed in the first region 10 on the gate insulation layer 150. The first gate electrode 170 may be formed on a portion of the gate insulation layer 150 under which the first active layer 130 is located. The first gate electrode 170 may be formed using a metal, a metal alloy, metal nitride, conductive metal oxide, transparent conductive materials, etc. For example, the first gate electrode 170 may include Au, Ag, Al, W, Cu, Pt, Ni, Ti, Pd, Mg, Ca, Li, Cr, Ta, Mo, Sc, Nd, Jr, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. Alternatively, the first gate electrode 170 may have a multi-layered structure including a plurality of layers.

Referring to FIG. 5, an insulating interlayer 190 may be formed in the first and second regions 10 and 20 on the gate insulation layer 150 and the first gate electrode 170. The insulating interlayer 190 may cover the first gate electrode 170 in the first region 10 on the gate insulation layer 150, and may be formed on the entire gate insulation layer 150. For example, the insulating interlayer 190 may cover the first gate electrode 170 on the gate insulation layer 150, and may be formed as a substantially uniform thickness along a profile of the first gate electrode 170. Alternatively, the insulating interlayer 190 may sufficiently cover the first gate electrode 170 on the gate insulation layer 150, and may have a substantially flat upper surface without a step around the first gate electrode 170. The insulating interlayer 190 may be formed using silicon compound, metal oxide, etc.

A gate electrode pattern 180 may be formed in the first region 10 on the insulating interlayer 190. The gate electrode pattern 180 may be formed on a portion of the insulating interlayer 190 under which the first gate electrode 170 is located. The gate electrode pattern 180 may serve as a wiring. For example, the gate electrode pattern 180 may be data signal wirings providing a data signal, gate signal wirings providing a gate signal, initialization signal wirings providing an initialization signal, light emission wirings providing a light emission signal, power supply voltage wirings providing a power supply voltage, etc. The gate electrode pattern 180 may be formed using a metal, an alloy of a metal, metal nitride, conductive metal oxide, transparent conductive materials, etc.

A second gate electrode 175 may be formed in the second region 20 on the insulating interlayer 190. In example embodiments, the second gate electrode 175 and the gate electrode pattern 180 may be located at a same layer, and may be simultaneously (or concurrently) formed using same materials. For example, after a preliminary gate electrode layer is formed on the entire insulating interlayer 190, the second gate electrode 175 and the gate electrode pattern 180 may be simultaneously formed by selectively etching the preliminary gate electrode layer. The second gate electrode 175 may be formed using a metal, an alloy of a metal, metal nitride, conductive metal oxide, transparent conductive materials, etc.

Referring to FIGS. 6 and 7, an insulation layer structure 300 may be formed on the insulating interlayer 190, the second gate electrode 175, and the gate electrode pattern 180. In example embodiments, the insulation layer structure 300 may include a first insulation layer 301, a second insulation layer 302, and a third insulation layer 303.

The first insulation layer 301 may cover the gate electrode pattern 180 in the first region 10 and the second gate electrode 175 in the second region 20 on the insulating interlayer 190, and may be formed on the entire insulating interlayer 190. For example, the first insulation layer 301 may cover the gate electrode pattern 180 and the second gate electrode 175 on the insulating interlayer 190, and may be formed as a substantially uniform thickness along a profile of the gate electrode pattern 180 and the second gate electrode 175. Alternatively, the first insulation layer 301 may sufficiently cover the gate electrode pattern 180 and the second gate electrode 175 on the insulating interlayer 190, and may have a substantially flat upper surface without a step around the gate electrode pattern 180 and the second gate electrode 175. In example embodiments, in a same etching process using the etchant of the BOE process, the first insulation layer 301 may have a first etching rate. Here, the first insulation layer 301 may be formed using an oxide-based insulation layer having the first etching rate. For example, the first insulation layer 301 may consist essentially of SiOx or AlOx. In addition, the first insulation layer 301 may have a first thickness T1.

The second insulation layer 302 may be formed on the first insulation layer 301. The second insulation layer 302 may be formed on the entire first insulation layer 301. For example, the second insulation layer 302 may be formed as a substantially uniform thickness along a profile of the first insulation layer 301. Alternatively, the second insulation layer 302 may sufficiently cover the first insulation layer 301, and may have a substantially flat upper surface. In example embodiments, in the same etching process using the etchant of the BOE process, the second insulation layer 302 may have a second etching rate that is greater than the first etching rate. For example, in the same etching process using the etchant of the BOE process, the second insulation layer 302 may be etched faster than the first insulation layer 301. In other words, in the same etching process using the etchant of the BOE process, the second insulation layer 302 may be etched more than the first insulation layer 301. Here, the second insulation layer 302 may be formed using a nitride-based insulation layer having the second etching rate. For example, the second insulation layer 302 may consist essentially of SiNx or TiNx. In addition, the second insulation layer 302 may have a second thickness T2 that is less than the first thickness T1.

The third insulation layer 303 may be formed on the second insulation layer 302. The third insulation layer 303 may be formed on the entire second insulation layer 302. For example, the third insulation layer 303 may be formed as a substantially uniform thickness along a profile of the second insulation layer 302. Alternatively, the third insulation layer 303 may sufficiently cover the second insulation layer 302, and may have a substantially flat upper surface. In example embodiments, in the same etching process using the etchant of the BOE process, the third insulation layer 303 may have a third etching rate that is less than the second etching rate. Here, the third insulation layer 303 may be formed using an oxide-based insulation layer having the third etching rate. For example, the third insulation layer 303 may consist essentially of SiOx or AlOx. In addition, the third insulation layer 303 may have a third thickness T3. The first insulation layer 301 and the third insulation layer 303 may include the same materials, and the first thickness T1 may be identical to the third thickness T3. The first etching rate and the third etching rate may be substantially the same. In addition, the second thickness T2 may be less than 30% of a thickness of the insulation layer structure 300. Alternatively, the first thickness T1 may be different from the third thickness T3, and the first etching rate may be different from the third etching rate. However, the first and third thicknesses T1 and T3 should be greater than the second thickness T2, and the third etching rate should be less than the second etching rate. Accordingly, the insulation layer structure 300 including the first insulation layer 301, the second insulation layer 302, and the third insulation layer 303 may be formed.

Figure 8:
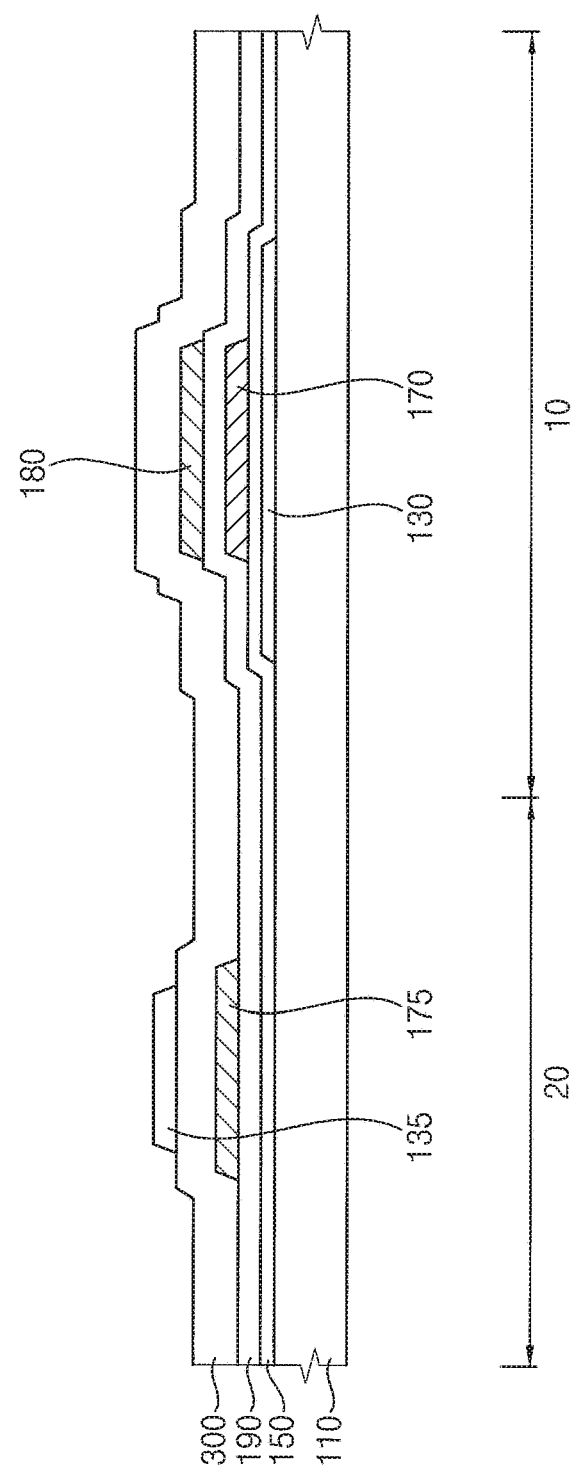

Referring to FIG. 8, a second active layer 135 may be formed in the second region 20 on the insulation layer structure 300. The second active layer 135 may be formed on a portion of the insulation layer structure 300 under which the second gate electrode 175 is located. The second active layer 135 may be formed using an oxide semiconductor. In other words, the second active layer 135 may include an oxide semiconductor layer including at least one of two-component compound (ABx), ternary compound (ABxCy), four-component compound (ABxCyDz), etc. These compounds contain In, Zn, Ga, Sn, Ti, Al, Hf, Zr, Mg, etc. For example, the second active layer 135 may include at least one of ZnOx, GaOx, TiOx, SnOx, InOx, IGO, IZO, ITO, GZO, ZMO, ZTO, ZnZrxOy, IGZO, IZTO, IGHO, TAZO, IGTO, etc.

Figure 9:
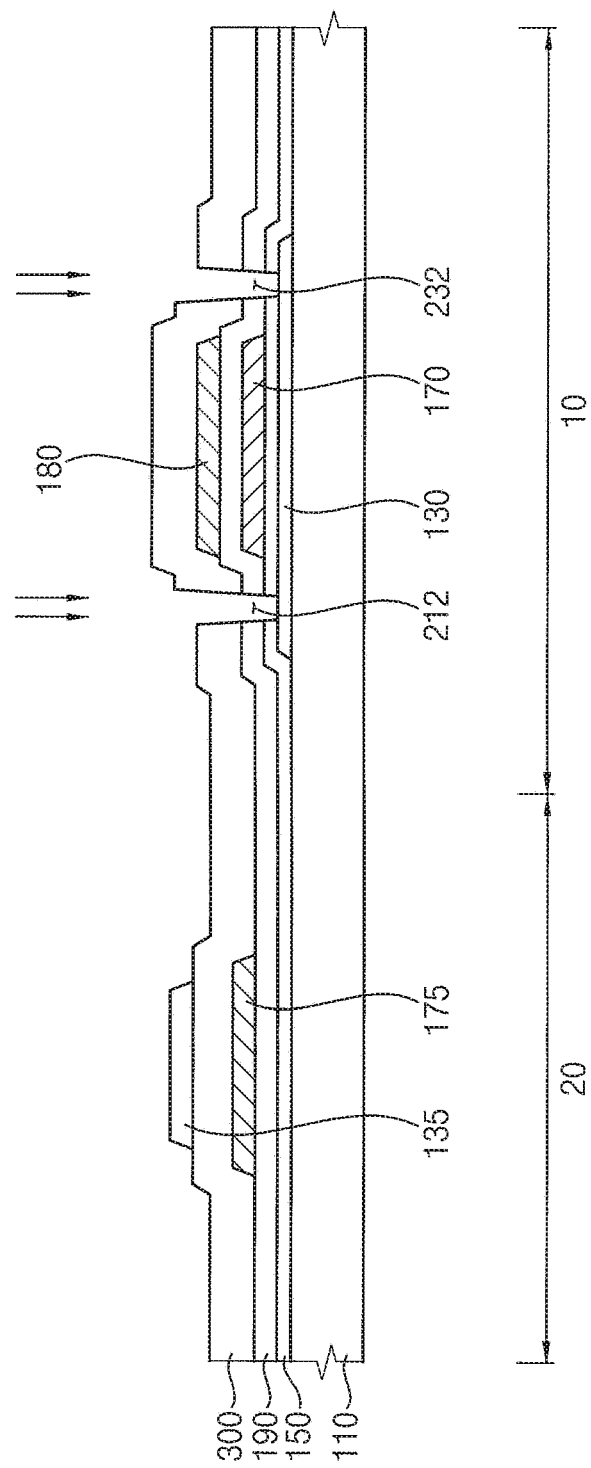

Referring to FIG. 9, a first contact hole 212 may be formed by removing a first portion of the insulation layer structure 300, the insulating interlayer 190, and the gate insulation layer 150 in the first region 10. The first contact hole 212 may extend to and expose a source region of the first active layer 130. In addition, a second contact hole 232 may be formed by removing a second portion of the insulation layer structure 300, the insulating interlayer 190, and the gate insulation layer 150 in the first region 10. The second contact hole 232 may extend to and expose a drain region of the first active layer 130. The first and second portions of the insulation layer structure 300, the insulating interlayer 190, and the gate insulation layer 150 may be removed through an oxygen plasma treatment process.

Figure 10:
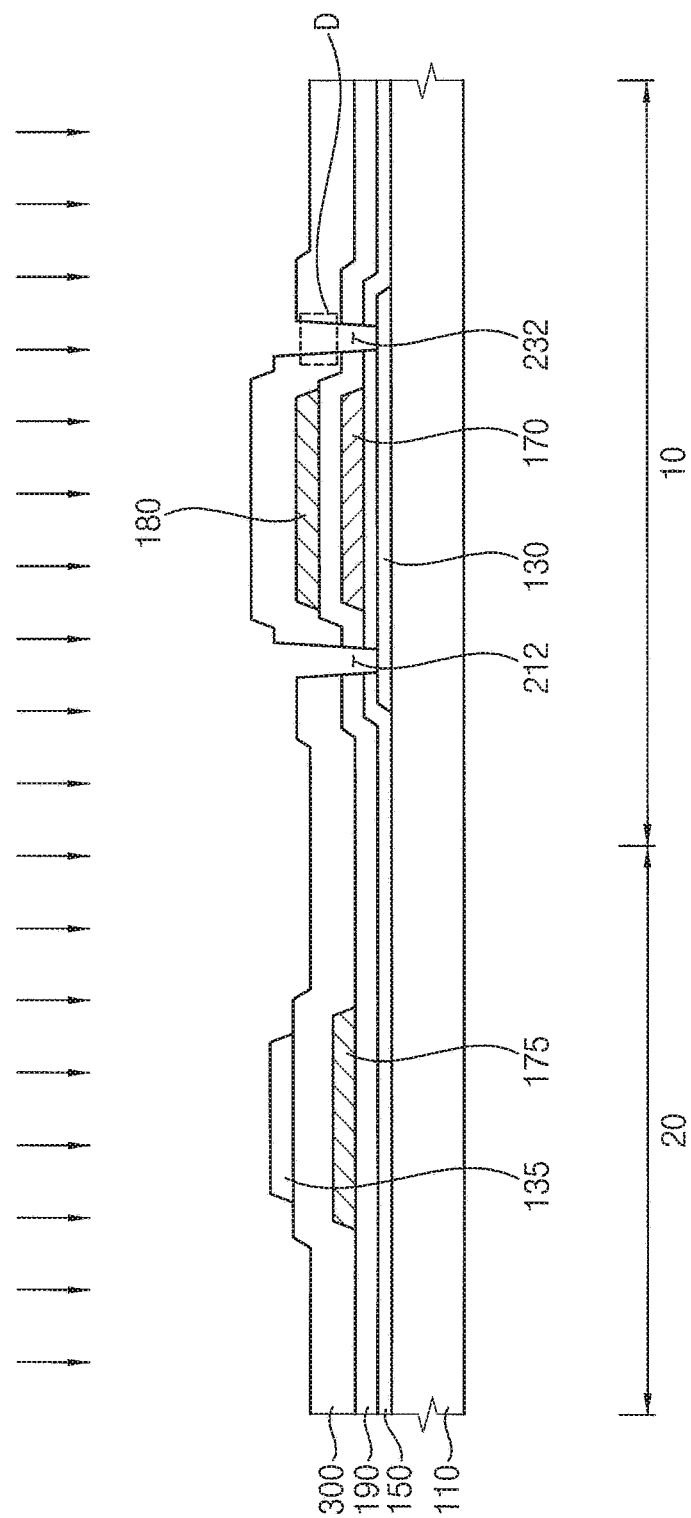
Figure 11:
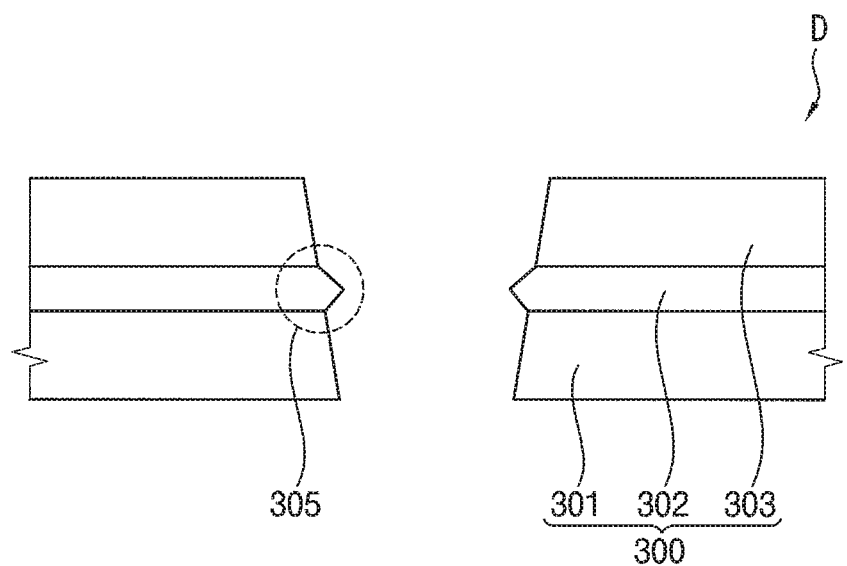

Referring to FIGS. 10 and 11, a heat treatment process may be performed on the substrate 110. In example embodiments, when the heat treatment process is performed on the first active layer 130, a driving-range of a first semiconductor element 250, which will be described below, that corresponds to a driving transistor may be relatively widened. In addition, when the heat treatment process is performed on the second active layer 135, the second semiconductor element 255 that is relatively precise may be obtained because a scattering of a threshold voltage of a second semiconductor element 255, which will be described below, that corresponds to a switching transistor is reduced. As the heat treatment process is simultaneously performed on the first active layer 130 and the second active layer 135, a manufacturing cost of an OLED device may be relatively decreased.

In the heat treatment process, an oxide layer (or oxides) may be formed in the source and drain regions of the first active layer 130. For example, after oxygen ions existing in a chamber reacts with an upper surface of the first active layer 130 exposed to an outside through the first contact hole 212 and the second contact hole 232, the oxide layer may be formed.

After the heat treatment process, to remove the oxide layer formed on the first active layer 130, a BOE process may be performed. In example embodiments, the insulation layer structure 300 may include the first insulation layer 301 having the first etching rate, which is formed under the second insulation layer 302 having the second etching rate. Accordingly, an under cut phenomenon is not generated in side walls of the insulation layer structure 300 located in the first contact hole 212 and the second contact hole 232. For example, as the insulation layer structure 300 includes the first insulation layer 301 having the first etching rate, which is less than the second etching rate, under the second insulation layer 302 having the second etching rate in the same etching process using the etchant of the BOE process, the under cut phenomenon by the etchant used in the BOE process may be prevented because the first insulation layer 301 located in the first and second contact holes 212 and 232 is etched relatively slower than the second insulation layer 302 in the BOE process. For example, the etchant may include hydrogen fluoride HF, ammonium fluoride, etc. As illustrated in FIG. 11, a protrusion 305 may be formed in the second insulation layer 302 located in the first and second contact holes 212 and 232 due to an etching rate difference of the first insulation layer 301 and the second insulation layer 302.

In example embodiments, the second thickness T2 of the second insulation layer 302 may be less than the first thickness T1 and the third thickness T3 such that a size of the protrusion 305 is not formed as a relatively large size. For example, when a thickness of the second insulation layer 302 is formed as a relatively thick thickness, a size of the protrusion 305 may be formed as a relatively large size. In this case, first source and first drain electrodes, which will be described below, may not be in contact with the first active layer 130, or a contact resistance may be increased. Thus, a thickness of the second insulation layer 302 may be formed less than 30% of a thickness of the insulation layer structure 300.

Accordingly, the first contact hole 212 and the second contact hole 232 may be readily formed without defects.

Figure 12:
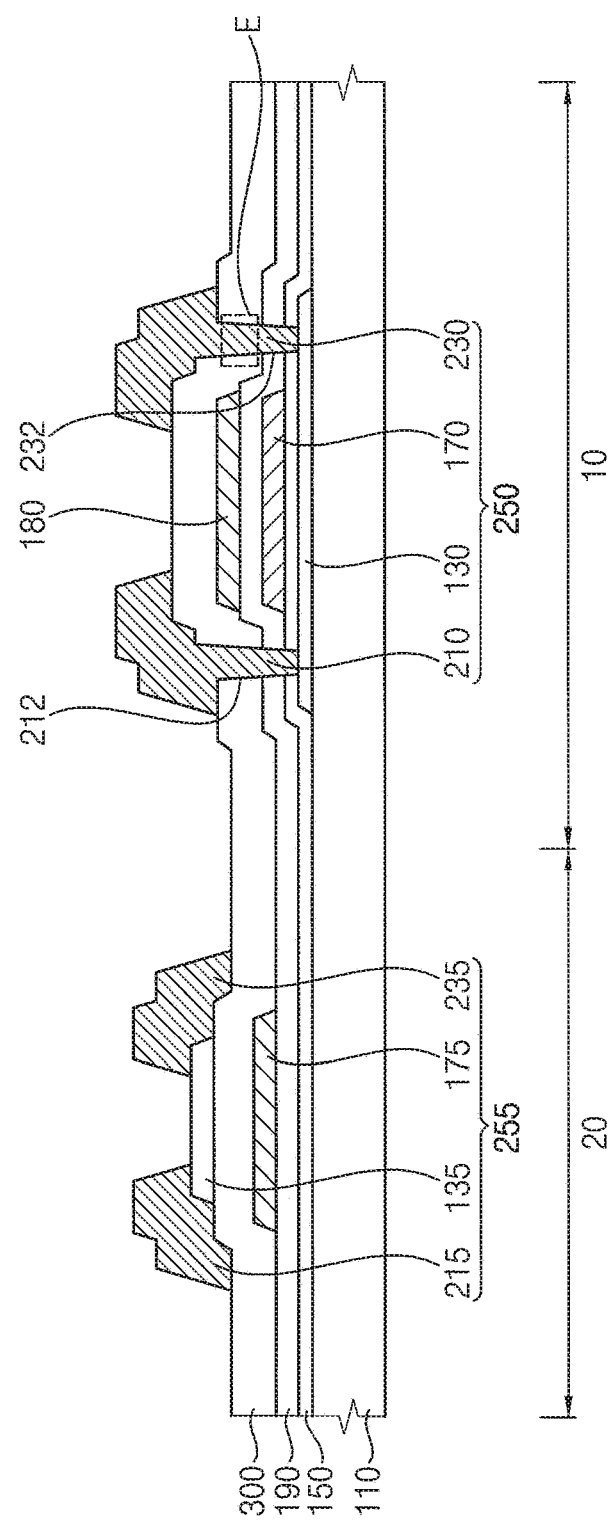
Figure 13:
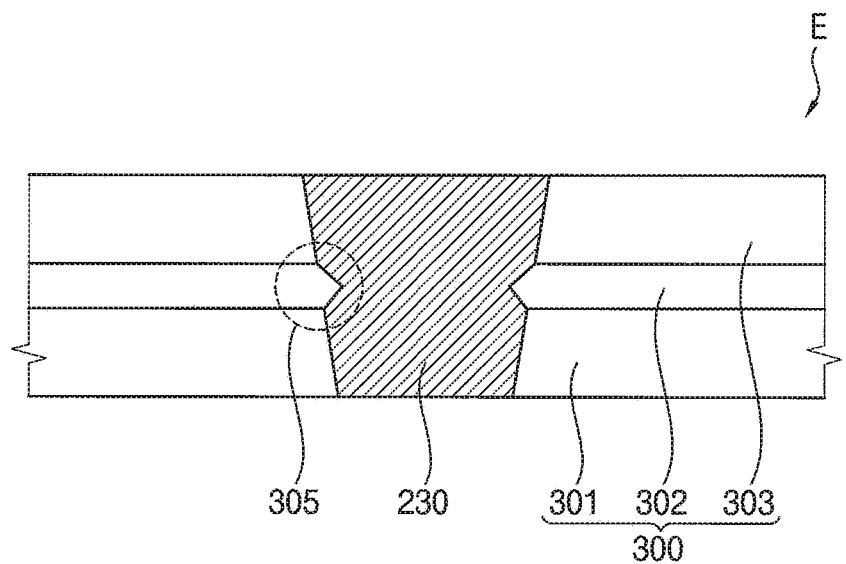

Referring to FIGS. 12 and 13, a first source electrode 210 and a first drain electrode 230 may be formed in the first region 10 on the insulation layer structure 300. The first source electrode 210 may be in contact with a source region of the first active layer 130 via the first contact hole 212, and the first drain electrode 230 may be in contact with a drain region of the first active layer 130 via the second contact hole 232. As illustrated in FIG. 13, each of the first source electrode 210 and the first drain electrode 230 may have a recess located adjacent to the protrusion 305 due to the protrusion 305 of the second insulation layer 302. Each of the first source electrode 210 and the first drain electrode 230 may be formed using a metal, an alloy, metal nitride, conductive metal oxide, transparent conductive materials, etc. These may be used alone or in a suitable combination thereof. In some example embodiments, each of the first source electrode 210 and the first drain electrode 230 may have a multi-layered structure including a plurality of layers. Accordingly, a first semiconductor element 250 including the first active layer 130, the first gate electrode 170, the first source electrode 210, and the first drain electrode 230 may be formed. Here, the first semiconductor element 250 may serve as a driving transistor having a silicon-based semiconductor. In addition, the first semiconductor element 250 may serve as a transistor having a top gate structure.

A second source electrode 215 and a second drain electrode 235 may be formed in the second region 20 on the insulation layer structure 300. The second source electrode 215 may cover a first lateral portion of the second active layer 135, and the second drain electrode 235 may cover a second lateral portion of the second active layer 135. Here, the first lateral portion may be different from the second lateral portion. In other words, the second source and second drain electrodes 215 and 235 may cover both lateral portions of the second active layer 135, and may expose a portion of an upper surface of the second active layer 135. Each of the second source and second drain electrodes 215 and 235 may be formed using a metal, an alloy of a metal, metal nitride, conductive metal oxide, transparent conductive materials, etc. These may be used alone or in a suitable combination thereof. In example embodiments, the first source and first drain electrodes 210 and 230 and the second source and second drain electrodes 215 and 235 may be located at a same layer, and may be simultaneously formed using same materials. For example, after a preliminary electrode layer is formed on the entire insulation layer structure 300, the first source and first drain electrodes 210 and 230 and the second source and second drain electrodes 215 and 235 may be simultaneously formed by selectively etching the preliminary electrode layer. In some example embodiments, each of the second source and second drain electrodes 215 and 235 may have a multi-layered structure including a plurality of layers. Accordingly, a second semiconductor element 255 including the second active layer 135, the second gate electrode 175, the second source electrode 215, and the second drain electrode 235 may be formed. Here, the second semiconductor element 255 may serve as a switching transistor including an oxide-based semiconductor. In addition, the second semiconductor element 255 may serve as a transistor having a bottom gate structure.

Figure 14:
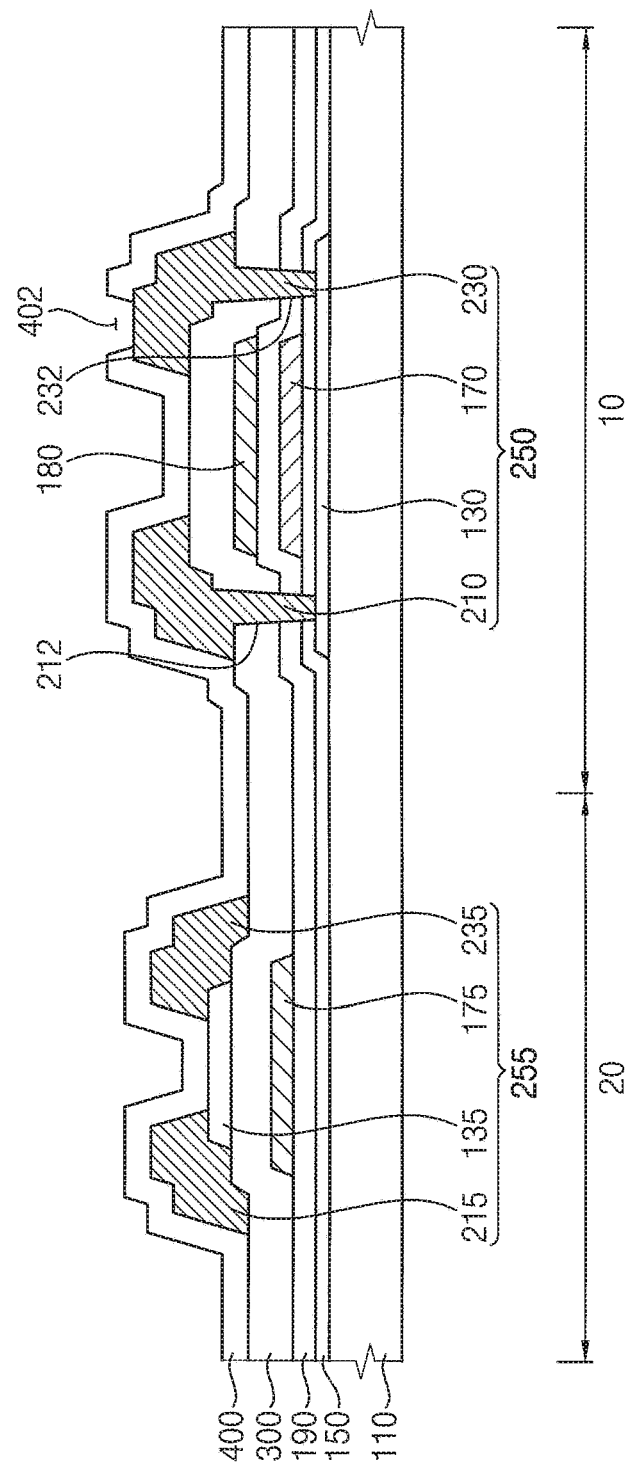

Referring to FIG. 14, a protective insulation layer 400 may be formed on the insulation layer structure 300, the first source and first drain electrodes 210 and 230, and the second source and second drain electrodes 215 and 235. The protective insulation layer 400 may cover the first source and first drain electrodes 210 and 230 in the first region 10 and the second source and second drain electrodes 215 and 235 in the second region 20 on the insulation layer structure 300, and may be formed on the entire insulation layer structure 300. For example, the protective insulation layer 400 may cover the first source and first drain electrodes 210 and 230 and the second source and second drain electrodes 215 and 235 on the insulation layer structure 300, and may be formed as a substantially uniform thickness along a profile of the first source and first drain electrodes 210 and 230 and the second source and second drain electrodes 215 and 235. Alternatively, the protective insulation layer 400 may sufficiently cover the first source and first drain electrodes 210 and 230 and the second source and second drain electrodes 215 and 235 on the insulation layer structure 300, and may have a substantially flat upper surface without a step around the first source and first drain electrodes 210 and 230 and the second source and second drain electrodes 215 and 235. In example embodiments, the protective insulation layer 400 may have an opening 402 extending to and exposing a portion of an upper surface of the first drain electrode 230 in the first region 10. The protective insulation layer 400 may be formed using silicon compound, metal oxide, etc. In example embodiments, the protective insulation layer 400 may consist essentially of SiOx. In addition, the protective insulation layer 400 may be in direct contact with an upper surface of the second active layer 135. As the protective insulation layer 400 consisting essentially of SiOx is in direct contact with the second active layer 135, interface characteristics of the second active layer 135 may be relatively improved.

Figure 15:
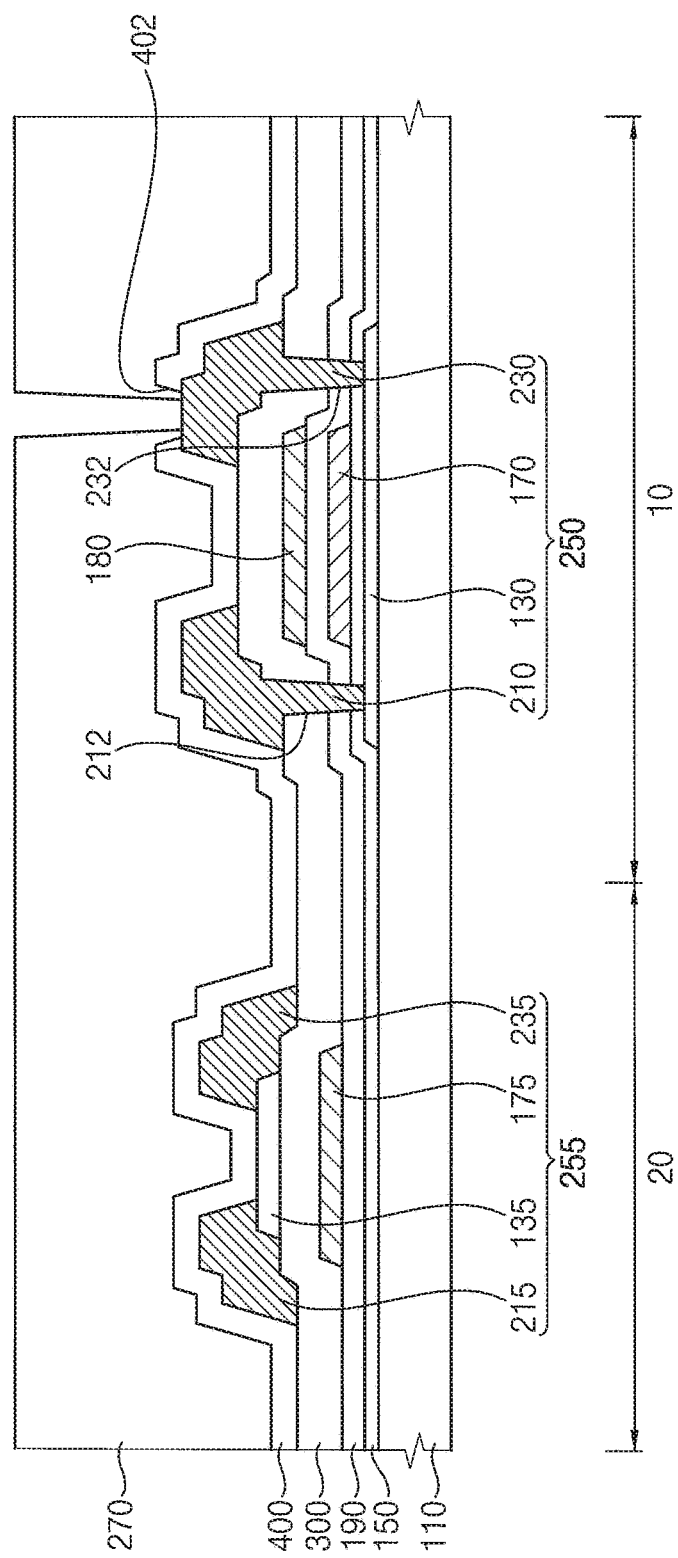

Referring to FIG. 15, a planarization layer 270 may be formed on the protective insulation layer 400. The planarization layer 270 may be formed on the entire protective insulation layer 400. For example, the planarization layer 270 may be formed as a high (large) thickness to sufficiently cover the protective insulation layer 400. In this case, the planarization layer 270 may have a substantially flat upper surface, and a planarization process may be further performed on the planarization layer 270 to implement the flat upper surface of the planarization layer 270. A portion of an upper surface of the first drain electrode 230 may be exposed via a contact hole formed by removing a portion of the planarization layer 270. The planarization layer 270 may include organic materials or inorganic materials. In example embodiments, the planarization layer 270 may be formed using organic materials such as polyimide, epoxy-based resin, acryl-based resin, polyester, photoresist, polyacryl-based resin, polyimide-based resin, a polyamide-based resin, a siloxane-based resin, etc.

Figure 16:
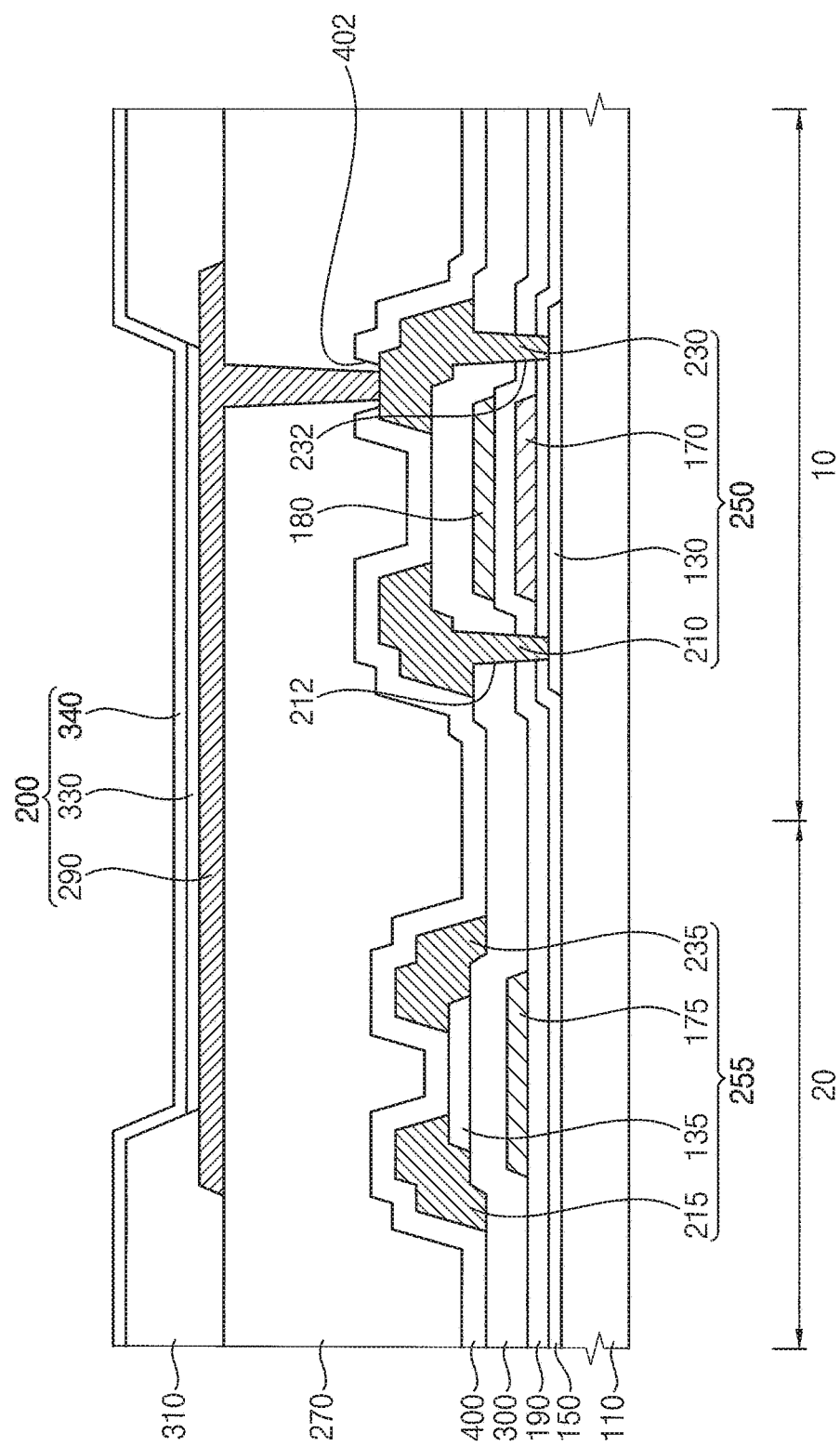

Referring to FIG. 16, a lower electrode 290 may be formed on the planarization layer 270. The lower electrode 290 may be in direct contact with the first drain electrode 230 via the contact hole of the planarization layer 270, and may be electrically connected to the first semiconductor element 250. The lower electrode 290 may be formed using a metal, a metal alloy, metal nitride, conductive metal oxide, transparent conductive materials, etc. These may be used alone or in a suitable combination thereof. Alternatively, the lower electrode 290 may have a multi-layered structure including a plurality of layers.

A pixel defining layer 310 may be formed on a portion of the lower electrode 290 and the planarization layer 270. The pixel defining layer 310 may cover both lateral portions of the lower electrode 290, and may expose a portion of an upper surface of the lower electrode 290. The pixel defining layer 310 may include organic materials or inorganic materials. In example embodiments, the pixel defining layer 310 may be formed using organic materials.

A light emitting layer 330 may be formed on the lower electrode 290 exposed by the pixel defining layer 310. The light emitting layer 330 may be formed using at least one of light emitting materials capable of generating different colors of light, e.g., a red color of light, a blue color of light, and a green color of light, etc., according to sub-pixels. Alternatively, the light emitting layer 330 may generally generate a white color of light by stacking a plurality of light emitting materials capable of generating different colors of light such as a red color of light, a green color of light, a blue color of light, etc. In this case, a color filter may be formed on the light emitting layer 330 (e.g., to overlap the light emitting layer 330 on a lower surface of an encapsulation substrate). The color filter may include at least one selected from a red color filter, a green color filter, and a blue color filter. Alternatively, the color filter may include a yellow color filter, a cyan color filter, and a magenta color filter. The color filter may be formed using a photosensitive resin, etc.

An upper electrode 340 may be formed on the pixel defining layer 310 and the light emitting layer 330. The upper electrode 340 may cover the light emitting layer 330 and the pixel defining layer 310, and may be entirely formed on the light emitting layer 330 and the pixel defining layer 310. The upper electrode 340 may be formed using a metal, a metal alloy, metal nitride, conductive metal oxide, transparent conductive materials, etc. These may be used alone or in a suitable combination thereof. Alternatively, the upper electrode 340 may have a multi-layered structure including a plurality of layers. Accordingly, a light emitting structure 200 including the lower electrode 290, the light emitting layer 330, and the upper electrode 340 may be formed.

An encapsulation substrate (not shown) may be formed on the upper electrode 340. The encapsulation substrate and the substrate 110 may include substantially same materials. For example, the encapsulation substrate may be formed using a quartz substrate, a synthetic quartz substrate, a calcium fluoride substrate, a fluoride-doped quartz substrate, a sodalime glass substrate, a non-alkali glass substrate, etc. In some example embodiments, the encapsulation substrate may include a transparent inorganic material or flexible plastic. For example, the encapsulation substrate may include a flexible transparent resin substrate. In this case, to increase flexibility of an OLED device, the encapsulation substrate may have a stacked structure where at least one inorganic layer and at least one organic layer are alternately stacked. Accordingly, the OLED device 100 illustrated in FIG. 1 may be manufactured.

The inventive concept may be applied to various display devices including an OLED device. For example, the inventive concept may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and features of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display (OLED) device comprising:
    a substrate having a first region and a second region that is adjacent to the first region;
    a first semiconductor element including:
        a first active layer disposed in the first region on the substrate;
        a first gate electrode disposed on the first active layer; and
        a first source electrode and a first drain electrode disposed on the first gate electrode;
    a second semiconductor element including:
        a second gate electrode disposed in the second region on the substrate;
        a second active layer disposed on the second gate electrode; and
        a second source electrode and a second drain electrode disposed on the second active layer;
    an insulation layer structure between the second gate electrode and the second active layer, the insulation layer structure in a same etching process including:
        a first insulation layer having a first etching rate;
        a second insulation layer disposed on the first insulation layer and having a second etching rate that is greater than the first etching rate; and
        a third insulation layer disposed on the second insulation layer and having a third etching rate that is less than the second etching rate, wherein a thickness of the second insulation layer is less than a thickness of each of the first and third insulation layers; and
    a light emitting structure on the insulation layer structure.

2. The OLED device of claim 1, wherein the first semiconductor element has a top gate structure and includes a silicon-based semiconductor, and the second semiconductor element has a bottom gate structure and includes a metal oxide-based semiconductor.

3. The OLED device of claim 2, wherein the first active layer of the first semiconductor element includes amorphous silicon or polysilicon.

4. The OLED device of claim 1, wherein the third insulation layer of the insulation layer structure is in contact with a lower surface of the second active layer.

5. The OLED device of claim 1, wherein the first insulation layer and the third insulation layer include an oxide-based insulation layer, and the second insulation layer includes a nitride-based insulation layer.

6. The OLED device of claim 5, wherein each of the first insulation layer and the third insulation layer consists essentially of silicon oxide, and the second insulation layer consists essentially of silicon nitride.

7. The OLED device of claim 1, wherein the first etching rate is identical to the third etching rate.

8. The OLED device of claim 1, further comprising:
a gate electrode pattern disposed on the first gate electrode.

9. The OLED device of claim 8, wherein the gate electrode pattern and the second gate electrode are located at a same layer.

10. The OLED device of claim 9, wherein the insulation layer structure is interposed between the first source electrode and the gate electrode pattern in the first region, the insulation layer structure is interposed between the first drain electrode and the gate electrode pattern in the first region, and the insulation layer structure is interposed between the second active layer and the second gate electrode in the second region.

11. The OLED device of claim 1, further comprising:
a gate insulation layer covering the first active layer in the first region on the substrate;
an insulating interlayer covering the first gate electrode in the first region on the gate insulation layer; and
a protective insulation layer covering the first source electrode and the first drain electrode and the second source electrode and the second drain electrode on the insulation layer structure.

12. The OLED device of claim 11, wherein the protective insulation layer is in contact with an upper surface of the second active layer.

13. The OLED device of claim 11, wherein the protective insulation layer consists essentially of silicon oxide.

14. The OLED device of claim 11, wherein the protective insulation layer has an opening exposing a portion of an upper surface of the first drain electrode in the first region.

15. The OLED device of claim 14, wherein the light emitting structure includes:
a lower electrode disposed on the first semiconductor element and the second semiconductor element;
a light emitting layer disposed on the lower electrode; and
an upper electrode disposed on the light emitting layer.

16. The OLED device of claim 15, further comprising:
a planarization layer disposed between the protective insulation layer and the lower electrode, the planarization layer comprising organic materials.

17. The OLED device of claim 16, wherein the planarization layer has a contact hole that extends to an upper surface of the first drain electrode to which the opening of the protective insulation layer extends, and
wherein the lower electrode is in contact with the first drain electrode through the contact hole of the planarization layer.

18. An organic light emitting display (OLED) device comprising:
a substrate having a first region and a second region that is adjacent to the first region;
a first semiconductor element including:
a first active layer disposed in the first region on the substrate;
a first gate electrode disposed on the first active layer; and
a first source electrode and a first drain electrode disposed on the first gate electrode;
a second semiconductor element including:
a second gate electrode disposed in the second region on the substrate;
a second active layer disposed on the second gate electrode; and
a second source electrode and a second drain electrode disposed on the second active layer;
an insulation layer structure between the second gate electrode and the second active layer, the insulation layer structure in a same etching process including:
a first insulation layer having a first etching rate;
a second insulation layer disposed on the first insulation layer and having a second etching rate that is greater than the first etching rate; and
a third insulation layer disposed on the second insulation layer and having a third etching rate that is less than the second etching rate; and
a light emitting structure on the insulation layer structure, wherein the insulation layer structure has a first contact hole extending to a first portion of the first active layer and a second contact hole extending to a second portion, which is different from the first portion, of the first active layer, and
wherein the second insulation layer has a protrusion in each of the first contact hole and the second contact hole.

19. The OLED device of claim 18, wherein each of the first source electrode and the first drain electrode has a recess in each of the first contact hole and the second contact hole, respectively.

* * * * *